(12) United States Patent
Lai et al.

(10) Patent No.: US 9,596,788 B1
(45) Date of Patent: Mar. 14, 2017

(54) HEXAGONAL BORON NITRIDE HEAT DISSIPATION STRUCTURE

(71) Applicants: Chung-Ping Lai, Zhubei (TW); Kuo-Hsin Chang, Dalin Township, Chiayi County (TW); Jia-Cing Chen, Tainan (TW)

(72) Inventors: Chung-Ping Lai, Zhubei (TW); Kuo-Hsin Chang, Dalin Township, Chiayi County (TW); Jia-Cing Chen, Tainan (TW)

( * ) Notice: Subject to any disclaimer, the term of this patent is extended or adjusted under 35 U.S.C. 154(b) by 0 days.

(21) Appl. No.: 14/952,946

(22) Filed: Nov. 26, 2015

(51) Int. Cl.
*H05K 7/20* (2006.01)
*H01L 23/373* (2006.01)

(52) U.S. Cl.
CPC ......... *H05K 7/2039* (2013.01); *H01L 23/373* (2013.01)

(58) Field of Classification Search
CPC .............. H01L 23/373; H01L 23/3733; H01L 23/3737; H05K 7/2039
USPC ........................................ 361/704, 705, 708
See application file for complete search history.

(56) References Cited

U.S. PATENT DOCUMENTS

| | | | | |
|---|---|---|---|---|
| 4,869,954 A * | 9/1989 | Squitieri | ................. | B32B 27/40 427/393.5 |
| 5,137,959 A * | 8/1992 | Block | ....................... | C01F 7/02 524/430 |
| 5,359,768 A * | 11/1994 | Haley | ................... | H01L 23/367 228/175 |
| 6,054,198 A * | 4/2000 | Bunyan | ..................... | C09K 5/06 156/247 |
| 6,054,520 A * | 4/2000 | Washio | .................... | C08K 3/38 501/96.4 |
| 6,096,414 A * | 8/2000 | Young | ...................... | C08K 3/22 428/220 |
| 6,432,497 B2 * | 8/2002 | Bunyan | ................... | H01L 23/36 257/712 |
| 6,705,388 B1 * | 3/2004 | Sorgo | ................. | H01L 23/3731 165/185 |
| 7,147,041 B2 * | 12/2006 | Mitchell | ............... | H01L 23/367 165/185 |
| 7,408,787 B2 * | 8/2008 | Matayabas, Jr. | ........ | C09K 5/063 257/E23.089 |
| 7,473,995 B2 * | 1/2009 | Rumer | ................ | H01L 23/4275 257/674 |
| 7,846,778 B2 * | 12/2010 | Rumer | ................ | H01L 23/4275 257/707 |
| 8,587,945 B1 * | 11/2013 | Hartmann | .......... | H05K 7/20454 361/679.53 |
| 2002/0050585 A1* | 5/2002 | Masayuki | ........... | H01L 23/3737 252/500 |
| 2002/0135984 A1* | 9/2002 | Greenwood | ........ | H01L 23/4275 361/708 |

(Continued)

*Primary Examiner* — Adrian S Wilson

(57) ABSTRACT

A hexagonal boron nitride heat dissipation structure includes a plurality of electronic components, plural thermally conductive buffer layers, and an electronic conductive heat dissipation element. Each electronic component is configured to generate heat, each thermally conductive buffer layer is made of hBN that has thermal conductivity range from 10 to 40 W/mK. Such structure can completely overcome the issue of short circuit of electronic devices. The cooling of modern electronic devices, which has limited space for cooling, can be improved by this simple structure that takes full advantage of hBN and other heat dissipation materials.

6 Claims, 1 Drawing Sheet

(56) References Cited

U.S. PATENT DOCUMENTS

2003/0118826 A1* 6/2003 Greinke .............. C04B 37/008
                                                    428/408
2007/0259211 A1* 11/2007 Wang .................. H01L 23/3737
                                                    428/698
2014/0020933 A1* 1/2014 Hedin .................. H05K 1/0201
                                                    174/252

* cited by examiner

HEXAGONAL BORON NITRIDE HEAT DISSIPATION STRUCTURE

FIELD OF THE INVENTION

The present invention relates to a hexagonal boron nitride heat dissipation structure which completely overcomes the issue of short circuit of electronic devices.

BACKGROUND OF THE INVENTION

Thermal interface materials nowadays have low heat conductivity that is inefficient to dissipate heat generated by electronics.

Generally, metals are used as the materials of heat sinks to dissipate heat, but it increase the cost of device.

Electronics have evolved very fast in recent years into smaller sizes, faster processing speed, so do devices become more compact with high capability. Due to this evolution, the heat dissipation of electronics gradually emerges as a serious problem, since density of generated heat is higher in a smaller size of device. Moreover, there are less space to accommodate heat spreaders and dissipaters. It is well known that electronic devices often crash under high temperature. Therefore, there is an urgent need for efficient heat dissipation for electronics.

Materials for heat dissipation in electronics need to be electrical insulate to prevent short circuit. Hexagonal boron nitride (hBN) has been widely used on this purpose.

Hexagonal boron nitride (hBN) has a 2D layer structure similar to graphite. hBN has very high thermal conductivity (400 W/mK) along basal plane, and its electronic insulate property makes it different from graphene. Together with hBN's excellent thermal, chemical stability, and electronic insulation, it is a promising material for heat dissipation and spreading in electron.

U.S. Pat. No. 6,054,520 disclosed hBN as fillers to make a heat dissipation sheet. The resulting silicone rubber composition had a low thermal resistance of 0.18° C./W.

US patent No. 20070259211 also disclosed a heat spreaders made of hBN. The extraction process decreased the amount of binder, which lead the spreader to have a thermal conductivity of 48 W/mK.

Besides heat spreaders, hBN has also been used as heat dissipation pastes, CN patent No. 104220533 disclosed a paste composition made of hBN, aluminum oxides and resins. Aluminum oxides increase the strength of coating, and the resulting paste has a thermal conductivity of 10 W/mK on the vertical direction.

Another patent invents a composition of hBN paste and applications such as printed circuit board (PCB). Patent CN 103087471 A disclosed 8 wt % BN filler was used, and such PCB shown a 3.43 W/mK thermal conductivity.

Patent US 2014/0020933A1 taught thermal conductivity of PCB shown a sharp increase when the composition is larger than 45 wt % BN, and reached max value of 15 W/mK at ca. 70 wt % BN in PCB substrate.

Although hBN can increase the thermal conductivity of a substrate or interlayer, the heat dissipation ability is still not high enough due to other additives such as adhesives and metal oxides.

In general, another heat dissipation component such as heat skin is attached to the heat conductive layer. For example, CN patent No. 203424617 disclosed a structure in which a metal fin is attached to heat spreader to enhance the heat dissipation.

However, heat skin made of metals is not only heavy but also increases the cost. It is also questionable whether such structure is beneficial to heat dissipation.

In fact, many heat sources in electronics generated from circuit elements or components such as LED filament or board, semiconductors chip or device, RF high power PCB, and so on.

Let heat dissipation materials contact heat source directly is the most efficient way to remove heat away.

However, metal or conductive heat dissipation coating cannot directly contact with such heat source because of short circuit issue for electronic conductive circuit elements or components.

The present invention has arisen to mitigate and/or obviate the afore-described disadvantages.

SUMMARY OF THE INVENTION

The primary objective of the present invention is to provide a hexagonal boron nitride heat dissipation structure which completely overcomes the issue of short circuit of electronic devices.

To obtain above objective, a hexagonal boron nitride heat dissipation structure provided by the present invention contains: a plurality of electronic components, plural thermally conductive buffer layers, and an electronic conductive heat dissipation element.

Said each electronic component is fixed onto each thermally conductive buffer layer.

Said each thermally conductive buffer layer is made of hexagonal boron nitride with thermal conductivity ranging from 10 to 40 W/mk, and a total thickness of said each layer is at least larger than 0.01 mm with robust strength so as to hold electronics.

The electronic conductive heat dissipation element is metal skin or is made in a heat dissipation coating manner.

Preferably, when said each electronic component is fixed onto said thermally conductive buffer layer by thermally conductive glue or directly molded.

Preferably, when the electronic conductive heat dissipation element is made of coating materials in the heat dissipation coating manner, the coating materials include any one of carbon materials, metal particles, far infrared-ray radiation oxide, and nitride powders.

Preferably, when the electronic conductive heat dissipation element is made of carbon materials in the heat dissipation coating manner, the carbon materials include any one of graphene, carbon black, graphite, carbon nanotubes, activated carbon, and natural graphite.

Preferably, when the electronic conductive heat dissipation element is made of metal particles in the heat dissipation coating manner, the metal particles include any one of Cu, Ni, Zn, Fe, Co, Ag, Au, Pt and their alloys.

Preferably, when the electronic conductive heat dissipation element is made of far infrared-ray radiation powders in the heat dissipation coating manner, the far infrared-ray radiation powders include any one of $SiO_2$, $Al_2O_3$, $TiO_2$, $ZrO_2$, ZrC, SiC, TaC, $TiB_2$, $ZrB_2$, $TiSi_2$, $Si_3N_4$, TiN, and BN.

DETAILED DESCRIPTION OF THE PREFERRED EMBODIMENTS

Figure 1:
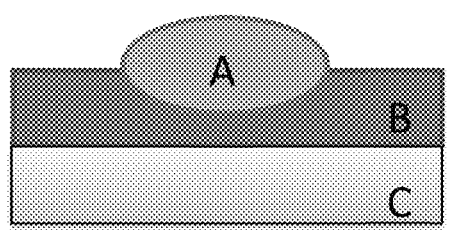
FIG. 1 is a schematic view illustrating the assembly of a hexagonal boron nitride heat dissipation structure according to a preferred embodiment of the present invention.
Figure 2:
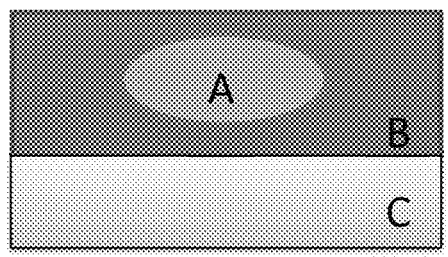
FIG. 2 is another schematic view illustrating the assembly of the hexagonal boron nitride heat dissipation structure according to the preferred embodiment of the present invention.
Figure 3:
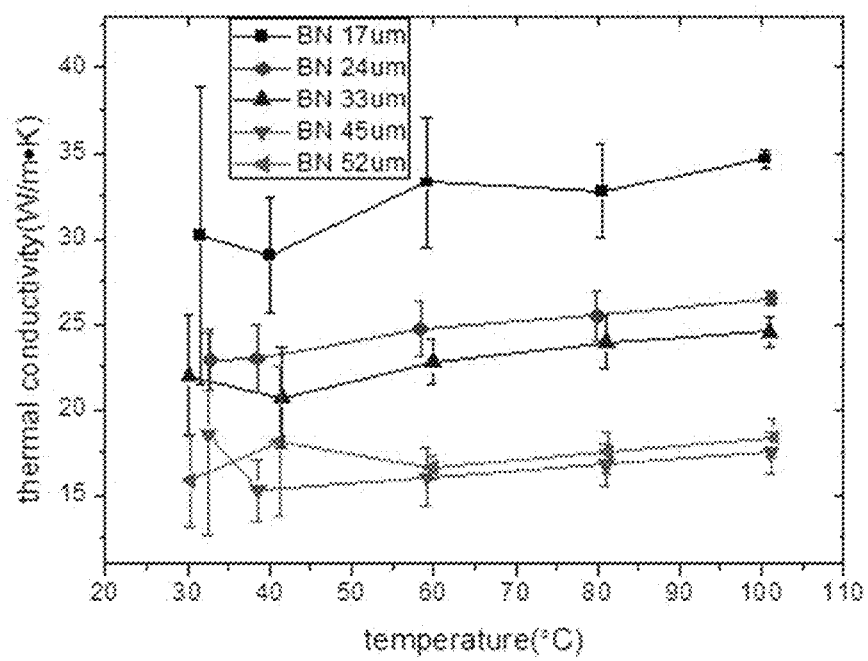
FIG. 3 is a schematic diagram illustrating thermal conductivity of h-BN film on various thicknesses according to the preferred embodiment of the present invention.

With reference to FIGS. 1 to 3, a hexagonal boron nitride heat dissipation structure according to a preferred embodiment of the present invention comprises: a plurality of electronic components A, plural thermally conductive buffer layers B, and an electronic conductive heat dissipation element C.

Each electronic components A is configured to use as heat source, such as any one of LED filament, LED board, semiconductors chip, semiconductor device, RF high power PCB, high power batteries, other device so as to generate heat.

Each thermally conductive buffer layer B is made of hexagonal boron nitride with thermal conductivity ranging from 10 to 40 W/mk. A total thickness of said each layer is at least larger than 0.01 mm with robust strength that can hold the electronics. Said each thermally conductive buffer layer could be either hard or flexible.

Said each electronic component A is fixed onto said thermally conductive buffer layer B by thermally conductive glue or directly molded.

The electronic conductive heat dissipation element C is metal skin or is made in a heat dissipation coating manner.

When the electronic conductive heat dissipation element C is made of coating materials in the heat dissipation coating manner, the coating materials include any one of carbon materials, metal particles, far infrared-ray radiation oxide, and nitride powders.

When the electronic conductive heat dissipation element C is made of carbon materials in the heat dissipation coating manner, the carbon materials include any one of graphene, carbon black, graphite, carbon nanotubes, activated carbon, and natural graphite.

When the electronic conductive heat dissipation element C is made of metal particles in the heat dissipation coating manner, the metal particles include any one of Cu, Ni, Zn, Fe, Co, Ag, Au, Pt and their alloys.

When the electronic conductive heat dissipation element C is made of far infrared-ray radiation powders in the heat dissipation coating manner, the far infrared-ray radiation powders include any one of $SiO_2$, $Al_2O_3$, $TiO_2$, $ZrO_2$, ZrC, SiC, TaC, $TiB_2$, $ZrB_2$, $TiSi_2$, $Si_3N_4$, TiN, and BN.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A hexagonal boron nitride heat dissipation structure comprising: a plurality of electronic components, plural thermally conductive buffer layers, and an electronic conductive heat dissipation element;

wherein said each electronic component is fixed onto said thermally conductive buffer layer;

wherein each thermally conductive buffer layer is made of hexagonal boron nitride with thermal conductivity ranging from 10 to 40 W/mk, and a total thickness of said each layer is at least larger than 0.01 mm with robust strength so as to hold the electronics; and wherein the electronic conductive heat dissipation element C is metal skin or is made in a heat dissipation coating manner.

2. The hexagonal boron nitride heat dissipation structure as claimed in claim 1, wherein said each electronic component is fixed onto said thermally conductive buffer layer by thermally conductive glue or directly molded.

3. The hexagonal boron nitride heat dissipation structure as claimed in claim 1, wherein when the electronic conductive heat dissipation element is made of coating materials in the heat dissipation coating manner, the coating materials include any one of carbon materials, metal particles, far infrared-ray radiation oxide, and nitride powders.

4. The hexagonal boron nitride heat dissipation structure as claimed in claim 1, wherein when the electronic conductive heat dissipation element is made of carbon materials in the heat dissipation coating manner, the carbon materials include any one of graphene, carbon black, graphite, carbon nanotubes, activated carbon, and natural graphite.

5. The hexagonal boron nitride heat dissipation structure as claimed in claim 1, wherein when the electronic conductive heat dissipation element is made of metal particles in the heat dissipation coating manner, the metal particles include any one of Cu, Ni, Zn, Fe, Co, Ag, Au, Pt and their alloys.

6. The hexagonal boron nitride heat dissipation structure as claimed in claim 1, wherein when the electronic conductive heat dissipation element is made of far infrared-ray radiation powders in the heat dissipation coating manner, the far infrared-ray radiation powders include any one of $SiO_2$, $Al_2O_3$, $TiO_2$, $ZrO_2$, ZrC, SiC, TaC, $TiB_2$, $ZrB_2$, $TiSi_2$, $Si_3N_4$, TiN, and BN.

* * * * *